United States Patent
Begon et al.

(10) Patent No.: US 6,958,666 B2
(45) Date of Patent: Oct. 25, 2005

(54) FILTERING CIRCUIT AND POWER SUPPLY DEVICE EQUIPPED WITH SAME

(75) Inventors: Patrice Begon, Saint Magne de Castillon (FR); José Picot, Colombes (FR)

(73) Assignee: Johnson Controls Automotive Electronics, Osny (FR)

( * ) Notice: Subject to any disclaimer, the term of this patent is extended or adjusted under 35 U.S.C. 154(b) by 54 days.

(21) Appl. No.: 10/466,011

(22) PCT Filed: Jan. 11, 2002

(86) PCT No.: PCT/FR02/00098

§ 371 (c)(1),
(2), (4) Date: Jul. 9, 2003

(87) PCT Pub. No.: WO02/056464

PCT Pub. Date: Jul. 18, 2002

(65) Prior Publication Data

US 2004/0051600 A1 Mar. 18, 2004

(30) Foreign Application Priority Data

Jan. 12, 2001 (FR) .............................. 01 00384

(51) Int. Cl.[7] .......................... H03H 7/00; H02M 1/12; H02J 1/02

(52) U.S. Cl. .................. 333/185; 333/181; 363/47; 307/105

(58) Field of Search ................................ 333/185, 181, 333/182; 363/47; 307/105

(56) References Cited

U.S. PATENT DOCUMENTS 2,611,010 A * 9/1952 Sass et al. .................. 361/818
6,218,910 B1 * 4/2001 Miller .......................... 333/33

FOREIGN PATENT DOCUMENTS

EP 325379 A * 7/1989 ............ H02M/1/12
JP 63283093 A * 11/1988 ............ H05K/1/14

* cited by examiner

Primary Examiner—James H. Cho
(74) Attorney, Agent, or Firm—Foley & Lardner LLP

(57) ABSTRACT

The invention provides a filter circuit comprising inductors (6, 15) and capacitors (11) interconnected to form filter stages, the capacitors (11) being distributed over at least two printed circuit cards (7, 8) disposed facing each other and spaced apart by a gap (H), at least one inductor (15) extending across the gap (H) between the cards and connected to both cards (7, 8). The invention also provides a power supply device equipped with such a filter circuit.

19 Claims, 2 Drawing Sheets

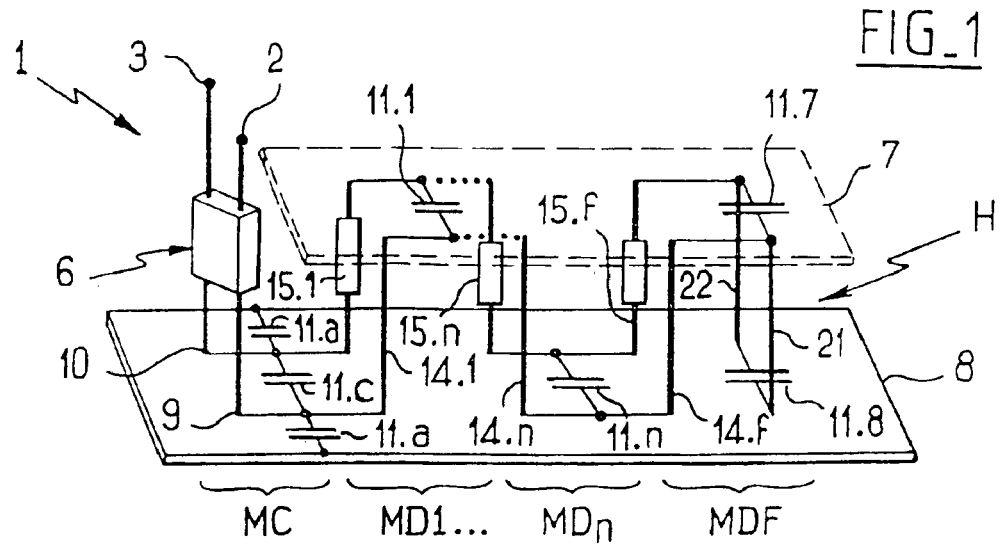
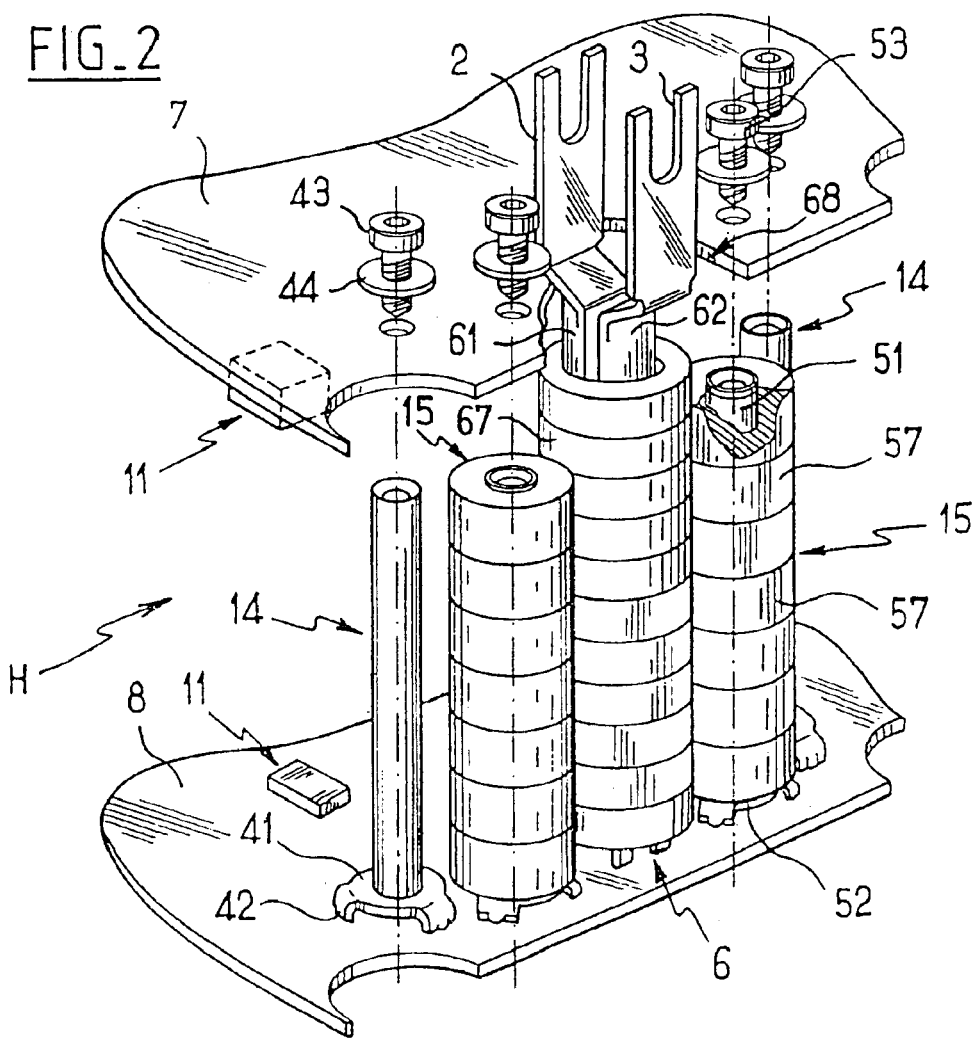

FILTERING CIRCUIT AND POWER SUPPLY DEVICE EQUIPPED WITH SAME

CROSS-REFERENCE TO RELATED APPLICATIONS

This application is a National Stage of Application PCT/FR02/00098, filed Jan. 11, 2002, incorporated herein by reference in its entirety.

BACKGROUND

The invention relates to a filter circuit and to a power supply device equipped with such a filter circuit. In the automotive field, more and more high power electrical actuators are being used. In order to power such actuators, it is known to use a power supply device comprising actuator control modules placed on a printed circuit card, together with a filter circuit comprising inductors and capacitors interconnected to form filter stages and also placed on the same card.

The inductors of a filter circuit suitable for conveying high powers are large in size. These components are generally placed parallel to the card and therefore occupy a significant area thereof. Since card area is limited, the inductors are sometimes mounted on the face opposite from the face which receives the control modules. That disposition makes assembly the card more complicated and causes it to have thickness that makes it awkward to integrate in compact power supply devices.

Proposals have also been made to place the inductors perpendicularly to the card, the connections with the printed circuit being adjacent to each other. Such a structure presents a major risk of stray capacitance between the connections.

SUMMARY

In order to make the filter circuit more compact, the invention provides a filter circuit in which the capacitors are distributed over at least two printed circuit cards placed facing each other and spaced apart by a determined gap, and in which at least one inductor extends across the gap between the cards and is connected to both cards.

Thus, the area occupied by the inductors on the cards is restricted to the area needed for connecting them, whereas the total are occupied by the capacitors is distributed over both cards. The area occupied by the filter circuit is thus considerably minimized. The inductor and capacitor components of the filter circuit can thus be placed on the same faces of the cards as the control modules.

In addition, the inductors then have electrical connections situated on each card. These connections are thus spaced apart from each other by a distance equal to the length of the inductor, thereby minimizing any risk of stray capacitance between said two connections.

Advantageously, each inductor extending across the gap between the cards comprises a stack of rings, at least one of which is made of ferromagnetic material, said stack being disposed around a conductor bar fixed to both cards. This provides an inductor that is compact and that enables a high current to be passed. In addition, such a structure is strong enough to act as a spacer between the two cards.

Advantageously, the filter circuit includes a common mode input stage which comprises an input inductor comprising a stack of rings, at least one of which is made of ferromagnetic material, said stack being placed around two parallel conductor bars fixed to one of the cards and extending across the gap between the cards, the bars being connected to a capacitor carried by the card to which the bars are fixed. This provides a common mode input stage that is particularly compact.

Also advantageously, the filter circuit includes at least one differential mode stage which comprises both a conductor rod and an associated inductor extending across the gap between the cards, the conductor rod and the inductor being connected to a capacitor carried by one of the cards. It is possible to build up a cascade of filter stages in this way in which the capacitors are carried in alternation by each of the cards.

Advantageously, the filter circuit has two output conductor rods connected to the capacitor of the last differential mode stage and fixed to both cards, extending across the gap between the cards. This makes it possible to distribute the output power of the filter circuit over both cards.

Advantageously, the output conductor rods are connected to two capacitors each carried by a respective card. This disposition provides better distribution of the area occupied on the cards by the capacitors.

In another aspect the invention provides a power supply device comprising control modules connected to a filter circuit of the invention, the control modules being disposed on facing faces of the printed circuit cards of the filter circuit.

The control modules are thus distributed over the two cards, thereby reducing the bulk of the power supply device. In addition, the control modules and the inductors of the filter circuit, i.e. the bulky components of the power supply device, are all contained in the gap between the cards. The housing of the power supply device can thus be designed to fit very closely around the outside faces of the cards, thereby reducing the overall size of the power supply device.

It is then advantageous for at least one cooling pipe to extend between the two cards in the vicinity of the control modules. The cooling pipe is thus efficient at picking up the heat given off by the control modules.

Advantageously, flexible heat sinks are connected to the cooling pipe and disposed around the inductors of the filter circuit. The heat given off by the inductors is thus picked up and conveyed to the cooling pipe, even when the inductors are not immediately adjacent to the cooling pipe.

BRIEF DESCRIPTION OF THE DRAWINGS

Other characteristics and advantages of the invention appear more clearly in the light of the following description of a particular, non-limiting embodiment of the invention, given with reference to the accompanying drawings and figures, in which:

FIG. 1 is a partially cutaway diagrammatic perspective view of a filter circuit of the invention, showing how the electrical components are distributed between the two printed circuit cards;

FIG. 2 is an exploded perspective view of a fraction of the inductors and the conductor rods of the filter circuit.

MORE DETAILED DESCRIPTION

Figure 3:
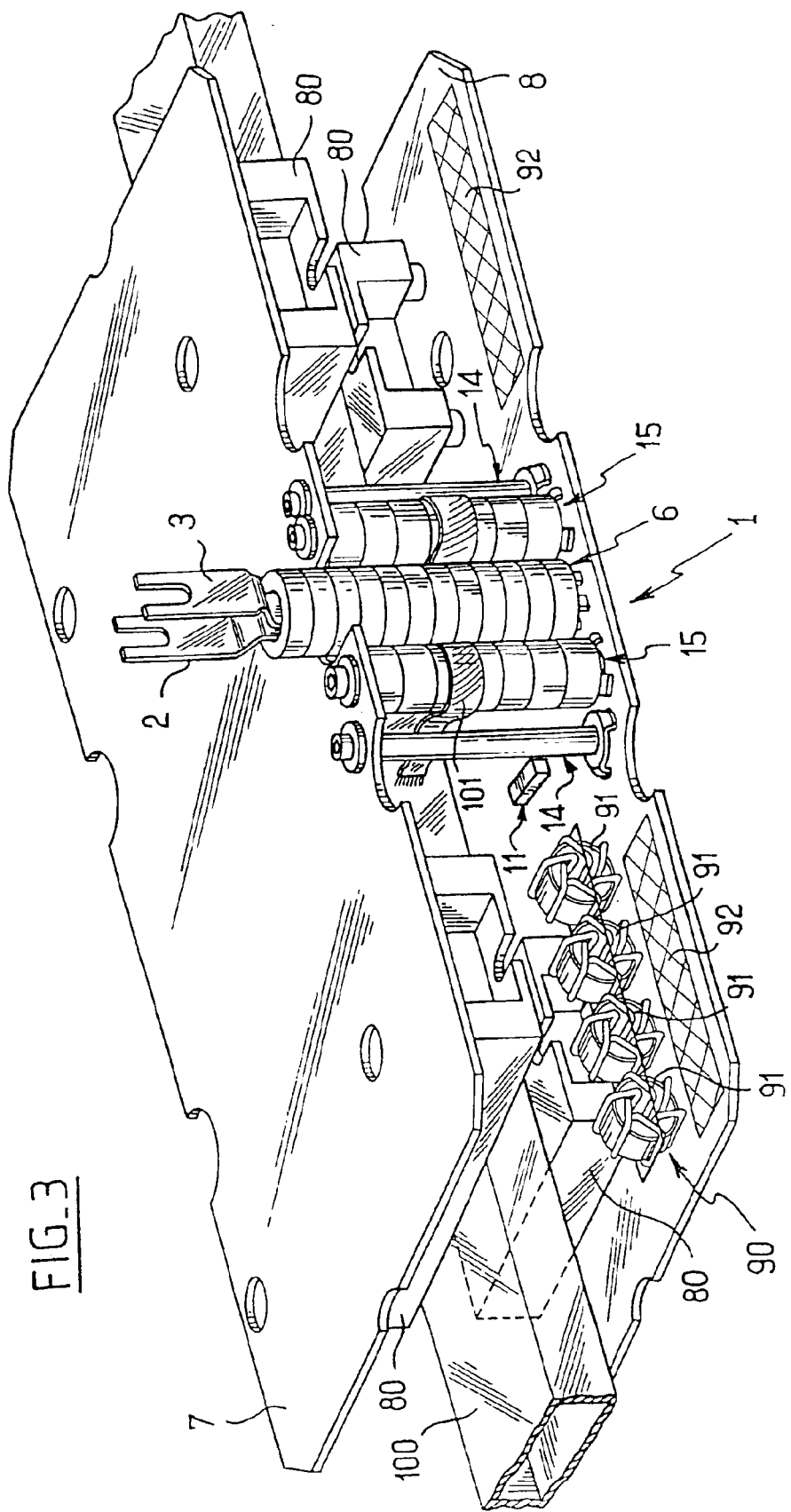
FIG. 3 is a perspective view of a power supply device of the invention equipped with the filter circuit shown above.

With reference to FIG. 1, a filter circuit 1 comprises in conventional manner inductors 15, capacitors 11, and conductors 14 arranged in a succession of filter stages, beginning with a common mode stage MC, and followed by one or more differential mode stages MD.

The filter circuit 1 comprises an input inductor 6 having two input terminals 2 and 3. In the invention, the input inductor 6 extends across a gap H between two printed circuit cards 7 and 8 that are placed facing each other, in this case parallel to each other. The input inductor 6 has two ends 9 and 10 connected to the card 8. Each of the ends 9 and 10 is connected via a respective conductor track to one terminal of a respective capacitor 11.a carried by the card 8, the other terminals of these capacitors being connected to a support chassis for the cards 7 and 8 (not shown) in order to be grounded. The ends 9 and 10 are also connected to respective terminals of a capacitor 11.c carried by the card 8 so as to co-operate with the capacitors 11.a and the inductor 6 to form the common mode stage MC of the filter circuit. The terminals of the capacitor 11.c form the output terminals of the common mode stage MC.

The output terminals of the common mode stage MC are connected to a first differential mode filter stage MD1 comprising an inductor 15 given particular reference 15.1 in order to enable it to be identified individually, and a conductor 14, more particularly a conductor rod 14.1. The inductor 15.1 and the conductor rod 14.1 extend across the gap H between the cards and they are connected to both cards 7 and 8. The conductor rod 14.1 and the inductor 15.1 are connected on the card 8 to the capacitor 11.c of the common mode stage MC. The conductor rod 14.1 and the inductor 15.1 are connected on the card 7 to a capacitor 11.1 so as to co-operate therewith to form the first differential mode stage MD1. The terminals of the capacitor 11.1 form the output terminals of the first differential mode stage MD1. A series of differential mode stages are made in the same manner, with the figure showing only the stage MDn preceding the final stage MDF.

For each differential stage, the capacitors 11.1 of the filter circuit are thus distributed in alternation on the cards 7 and 8, and preferably on the facing faces of the cards, while the inductors 15.n and the conductor rod 14.n extend across the gap H between the cards. The inductances of the inductors and the capacitances of the capacitors can vary from stage to stage, but they are preferably identical in order to simplify assembly.

The filter circuit is terminated by a final differential mode stage MDF comprising a conductor rod 14.f and an inductor 15.f extending across the gap H between the cards and connected to both cards 7 and 8. The conductor rod 14.f and the inductor 15.f are connected to two output conductor rods 21 and 22 between which capacitors 11.7 and 11.8 carried respectively by the cards 7 and 8 are connected. The capacitors 11.7 and 11.8 are thus connected in parallel and are equivalent to a single capacitor of capacitance equal to the sum of the capacitances of two capacitors 11.7 and 11.8. This disposition serves to distribute the capacitors of the final stage MDF forming the output capacitance of the filter circuit, and thus serves to distribute in analogous manner the output power of said circuit over both cards.

In a preferred embodiment shown in FIG. 2, the conductor rods 14 are generally circularly cylindrical in shape, each comprising a pin 41 soldered at one end to one of the cards, in this case the card 8. In this case, the pin 41 has a tripod with legs 42 received in shaped orifices in the card 8. The legs 42 are designed to pass through the card 8 so that they can be flow-soldered to conductor tracks (not visible) made on the face of the card 8 opposite from its face receiving the conductor rod 14.

The conductor rod 14 extends perpendicularly to the cards 7 and 8 across the gap H between the cards. It is fixed to the card 8 by a screw 43 carrying a washer 44 providing mechanical support, and also electrical connection with a conductor track (not shown) formed on the outside face of the card 7. The term "outside face" is used in the present specification to mean that face of a card which is not facing a face of the other card.

An inductor 15 comprises a conductor bar 51, one end of which can be seen in FIG. 2 projecting beyond a stack of rings 57. The conductor bar 51 has a connection pin 52 soldered to the card 8 and its opposite end is fixed by means of a screw 53 for connection with the card 7.

Rings 57 of ferromagnetic material are placed around the conductor bar 51. The rings 57 co-operate with the conductor bar 51 to form an inductor. In order to vary inductance, it is possible to vary the size of the rings 57, the number of the rings, or the magnetic permeability of the material from which they are made. If the height of the ferromagnetic rings is not sufficient to cover the full height of the conductor bar 51, the ferromagnetic rings can be held in place with magnetically permeable rings so as to prevent any movement of the rings 57 on the conductor bar 51.

Using the same design, the input inductor 6 has two parallel conductor bars 61 and 62. The conductor bars 61 and 62 are placed facing each other and they are surrounded by ferromagnetic rings 67. This provides a filter inductor in common mode.

Each of the conductor bars 61 and 62 carries one of the input terminals 2, 3 of the filter circuit 1. The opposite ends of the conductor bars 61 and 62 are connected to the card 8 by connection means of a type essentially similar to that used for connecting the conductor rods 14 to the card 8. The input inductor 6 in this case is taller than the gap H between the cards, so a recess 68 is provided in the card 7 to allow it to pass through.

The inductors 15 and the conductor rods 14 are connected, as described above, to the capacitors 11 carried by the facing faces of the cards 7 and 8. The capacitors 11 are represented symbolically by rectangular blocks, and they are much smaller in size than the inductors which are adapted to carry high power levels, and as a result the capacitors occupy only a small area on the cards 7 and 8. The capacitors 11 can be stacked on one another in order to adjust the capacitance they present, and also reduce the area they occupy on the cards.

FIG. 3 shows a power supply device of the invention comprising an input filter circuit 1 disposed between two cards 7 and 8 in the arrangement described with reference to the two preceding figures. The cards 7 and 8 of the filter circuit 1 are equipped with control modules 80 generally in the form of rectangular blocks. There are four control modules 80 in this case and they are arranged two per card on the facing faces of the cards 7 and 8, i.e. on the same faces as carry the capacitors 11 of the filter circuit 1. Each control module 8 is juxtaposed with its neighbor on the same card via a long side, and each control module 80 faces another control module on the other card.

The control modules 80 receive power via the filter circuit 1, and each of them delivers power to a group of power actuators (not shown) to which the power supply device is connected. Each of the control modules 80 is fitted with an output filter 90. Only one of the output filters 90 is shown in the figure. The output filter 90 is made up of inductors 91 of traditional type comprising a conductor wound around a ferromagnetic torus. The inductors 91 are much smaller in size than the inductors of the filter circuit 1, since the power they convey is considerably smaller than the power which passes through the filter circuit 1. The inductors 91 are disposed on a card in the vicinity of the associated control module. A zone represented in FIG. 3 by a shaded area 92 is reserved on the side of a card beside a filter 90 in order to enable a connector (not shown) to be installed thereon, thus enabling the conductors to be connected to a cable for taking the power from the control module 80 via the filter 90 to the actuators.

In order to cool the power supply device, a cooling pipe 100 is arranged to extend between the cards 7 and 8. The pipe 100 is of flat rectangular section so as to pass between the four control modules 80 carried by the cards, and so as to come into contact with the control modules 80. This disposition of the pipe 100 provides large amounts of heat exchange area with the control modules 80. Heat exchange is further increased by the flat shape of the pipe 100. The cooling fluid flowing in the pipe 100 takes away a fraction of the heat generated by the control modules 80 in operation.

The inductors of the filter circuit 1 are quite far away from the pipe 100 because they are located on one edge of the cards 7 and 8. In order to cool them, a flexible heat sink 101 connected to the pipe 100 is placed around each of the inductors 6 and 15 in order to carry away a fraction of the heat they generate and take it to the pipe 100.

The invention is not limited to the particular embodiment described above, but on the contrary covers any variant coming within the scope of the invention as defined by the claims.

In particular, although the filter circuit of the invention is described with inductors and conductor rods extending perpendicularly to the cards, these elements could extend between the facing cards at an inclined angle in order to optimize the volume occupied by the power supply device, while also accommodating the length of the inductors. For this purpose, it is possible, if necessary, to provide different angles of inclination depending on the positions of the inductors.

Although the filter circuit of the invention is shown with two cards only, the architecture of the filter circuit can be adapted to the shape of the volume available for receiving the filter circuit, for example by providing more than two cards located at different levels, with the conductor rods and the inductors extending across the gaps between the pairs of adjacent cards.

Although the inductors and the conductor rods are described as being grouped together in a zone of limited area of the cards, these elements could be dispersed so as to cause them to act mechanically as spacers between the cards.

Although the filter circuit described above is applied to a power supply device, the same architecture could also be applied in other fields of electronics which require the use of filters.

What is claimed is:

1. A filter circuit comprising:
    inductors and capacitors connected to form filter stages,
    wherein the capacitors are distributed over at least two printed circuit cards that are disposed facing each other,
    wherein at least one inductor extends across a gap between two of the at least two printed circuit cards and is connected to both of the two printed circuit cards between which it extends; and
    wherein each inductor extending across the gap comprises a stack of rings at least one of which is made of ferromagnetic material, said stack being disposed around a conductor bar fixed to both of the two printed circuit cards.

2. A filter circuit according to claim 1, further comprising two output conductor rods fixed to two of the at least two printed circuit cards and extending across the gap.

3. A filter circuit according to claim 2, wherein the conductor rods are connected to two capacitors each of which is carried by a respective one of the two of the at least two printed circuit cards.

4. A filter circuit according to claim 1, wherein at least one inductor or one conductor rod extending across the gap is perpendicular to the two of the at least two printed circuit cards.

5. A filter circuit according to claim 1, further comprising a common mode input stage comprising the input inductor comprising the stack of rings, the bars being connected to a capacitor carried by the one of the at least two printed circuit cards to which the two conductor bars are fixed.

6. A filter circuit according to claim 1, further comprising at least one differential mode filter stage comprising both a conductor rod and an associated inductor extending across the gap, the conductor rod and the inductor being connected to a capacitor carried by one of the at least two printed circuit cards.

7. A filter circuit according to claim 1, further comprising at least one pipe of a cooling circuit that extends between two of the at least two printed circuit cards in the vicinity of the control modules.

8. A filter circuit according to claim 7, further comprising flexible heat sinks connected to at least one of the at least one pipe and disposed around the inductors of the filter circuit.

9. A filter circuit according to claim 7, further comprising at least one differential mode filter stage comprising both a conductor rod and an associated inductor extending across the gap, the conductor rod and the inductor being connected to a capacitor carried by one of the at least two printed circuit cards.

10. A filter circuit comprising:
    inductors and capacitors connected to form filter stages, the capacitors being distributed over at least two printed circuit cards that are disposed facing each other;
    a common mode input stage comprising an input inductor comprising a stack of rings, at least one of which is made of ferromagnetic material, said stack being placed around two parallel conductor bars fixed to one of the at least two printed circuit cards and extending across the gap, the bars being connected to a capacitor carried by the one of the at least two printed circuit cards to which the two conductor bars are fixed;
    wherein at least one inductor extends across a gap between two of the at least two printed circuit cards and is connected to both of the two printed circuit cards between which it extends.

11. A filter circuit comprising:
    inductors and capacitors connected to form filter stages,
    at least one differential mode filter stage comprising both a conductor rod and an associated inductor extending across the gap, the conductor rod and the inductor being connected to a capacitor carried by one of the at least two printed circuit cards;
    wherein the capacitors are distributed over at least two printed circuit cards that are disposed facing each other; and
    wherein at least one inductor extend across a gap between two of the at least two printed circuit cards and is connected to both of the two printed circuit cards between which it extends.

12. A power supply device comprising:

a filter circuit comprising inductors and capacitors connected to form filter stages, the capacitors being distributed over at least two printed circuit cards that are disposed facing each other;

control modules connected to the filter circuit, the control modules disposed on facing faces of printed circuit cards of the filter circuit;

wherein at least one inductor extends across a gap between two of the at least two printed circuit cards and is connected to both cards; and wherein each inductor extending across the gap comprises a stack of rings at least one of which is made of ferromagnetic material, said stack being disposed around a conductor bar fixed to both of the two printed circuit cards.

13. A power supply device according to claim 12, further comprising at least one pipe of a cooling circuit that extends between two of the at least two printed circuit cards in the vicinity of the control modules.

14. A power supply device according to claim 13, further comprising flexible heat sinks connected to at least one of the at least one pipe and disposed around the inductors of the filter circuit.

15. A power supply device according to claim 12, further comprising a common mode input stage comprising the input inductor comprising the stack of rings, the bars being connected to a capacitor carried by the one of the at least two printed circuit cards to which the two conductor bars are fixed.

16. A power supply device according to claim 15, at least one differential mode filter stage comprising both a conductor rod and an associated inductor extending across the gap, the conductor rod and the inductor being connected to a capacitor carried by one of the at least two printed circuit cards.

17. A power supply device according to claim 12, at least one differential mode filter stage comprising both a conductor rod and an associated inductor extending across the gap, the conductor rod and the inductor being connected to a capacitor carried by one of the at least two printed circuit cards.

18. A power supply device comprising:

a filter circuit comprising inductors and capacitors connected to form filter stages, the capacitors being distributed over at least two printed circuit cards that are disposed facing each other;

control modules connected to the filter circuit, the control modules disposed on facing faces of printed circuit cards of the filter circuit; and at least one pipe of a cooling circuit that extends between two of the at least two printed circuit cards in the vicinity of the control modules;

wherein at least one inductor extends across a gap between two of the at least two printed circuit cards and is connected to both cards.

19. A power supply device according to claim 18, further comprising flexible heat sinks connected to at least one of the at least one pipe and disposed around the inductors of the filter circuit.

* * * * *